Jan. 21, 1969 S. DIX ET AL 3,423,638
MICROMODULAR PACKAGE WITH COMPRESSION MEANS
HOLDING CONTACTS ENGAGED
Filed Sept. 2, 1964 Sheet 1 of 2

INVENTORS:
Sydney Dix
David W. Davis
By Smyth, Roston & Pavitt
Attorneys

INVENTORS:
Sydney Dix
David W. Davis
By Smyth, Roston & Pavitt
Attorneys 3,423,638
Patented Jan. 21, 1969

3,423,638

MICROMODULAR PACKAGE WITH COMPRESSION MEANS HOLDING CONTACTS ENGAGED

Sydney Dix and David W. Davis, Costa Mesa, Calif., assignors, by mesne assignments, to GTI Corporation, Providence, R.I., a corporation of Rhode Island Filed Sept. 2, 1964, Ser. No. 394,000
U.S. Cl. 317—101 12 Claims
Int. Cl. H02b *1/04*

The present invention relates to electronic devices and more particularly to means for packaging electronic devices.

A large number of solid state electronic components such as semiconductive devices like transistors, diodes, etc. must be hermetically sealed to protect them from their environment. During the early development of semiconductive devices, a separate housing was provided for each semiconductive device. More recently, in order to reduce the size, cost, weight and to improve reliability and efficiency, so-called micromodular or integrated circuits have been developed. These circuits are formed by laying down a large number of different semiconductive devices in various regions of a single semiconductive wafer. These devices are interconnected with each other to form a self-contained circuit on the semiconductive wafer.

Since the semiconductive wafers are of a delicate nature and readily contaminated by moisture, dirt, etc., the semiconductive wafer must also be hermetically sealed in a suitable package. One form of package that is being developed at the present time is the so-called flat pack. A flat pack is relatively thin and flat and normally includes top and bottom portions that are hermetically bonded together to seal the semiconductive wafer inside thereof.

Heretofore, prior to sealing the semiconductive wafer in the package, it has been necessary to first securely attach the wafer to the bottom portion of the package. This has been accomplished by forming a mounting pad of a material such as a gold amalgam on the bottom portion at the time the bottom portion is manufactured. At the time the package is to be sealed, an operator manually places the wafer on the mounting pad and then proceeds to bond the wafer thereto. This has been a predominantly manual operation requiring a substantial amount of skill and time. In addition, the operation has also required a very expensive wafer bonding machine. During the wafer bonding operation, the wafer and bottom portion are heated to a sufficient level to cause the mounting pad to melt. In order to insure an effective bond, it has been necessary to press the wafer against the mounting pad and move the wafer around so as to break the surface tension and cause a complete wetting of all the surfaces. Frequently, this "scrubbing" of the wafer results in the wafer being secured to the bottom portion in a crooked or cocked position.

After the wafer has been properly bonded to the bottom portion of the package, the various electrical region on the wafer must be electrically interconnected with electrical leads. These leads project from the outside of the package and permit interconnecting the integral circuit with external circuitry. Heretofore, this has been accomplished by soldering or welding electrically conductive wires between the inner ends of the leads and the various regions on the wafer. These wires of necessity must be very small, for example, on the order of about 0.001 inch in diameter or even smaller. In order to connect such fine wires, it is necessary to employ a so-called wire bonding machine. Such machines are very expensive and requires a large amount of skill and patience to operate. However, due to the very small sizes and the high degree of accuracy required, it is necessary for a very skillful operator to perform the wire bonding operation. The operator must employ a microscope or similar device to magnify the work area. As a result, even a very skillful and efficient operator requires a substantial amount of time to complete the wire bonding operation. In fact, the wire bonding operation on a single package containing a reasonably complex circuit may require a period of time approaching or even exceeding an hour.

During the wire bonding operation, certain amounts of heat are required to attach the wires to the wafer. In the event the wire bond is not properly made, the temperature may build up in the wafer to a level that affects or destroys the electrical character of the wafer. In the event the bonded wafer is twisted or cocked enough to make it necessary for one or more of the bonding wires to be crossed, it is necessary to discard the package as crossed wires may eventually contact and short out. In some circuits, it is necessary for the wires to be crossed. When the package is sealed, these wires may be forced together as the cover portion is bonded into position.

Prior to, during and following the wafer bonding and wire bonding operations described above, it is necessary to perform various preparation and inspection operations. It may thus be seen that heretofore the sealing of integrated circuits into micromodular packages has required a large investment in production equipment and has a slow and costly procedure.

The present invention provides means for overcoming the foregoing difficulties. More particularly, the present invention provides means for assembling and sealing micromodular packages containing integrated circuits without the necessity of employing large amounts of expensive production equipment and manual labor. It also provides micromodular packages and integrated circuits which are cheaper and more reliable. This is accomplished by, among other things, eliminating the wafer bonding and wire bonding operations together with the associated preparation and inspection operations, etc. Means are also provided for eliminating the interconnecting wires between the leads and the wafer and also the possibility of such wires breaking or shorting out.

In one operative embodiment of the present invention, this is accomplished by providing a micromoduler package having two separate portions that are joined together to hermetically seal the wafer inside. One of these portions includes means for receiving the semiconductive wafer and maintaining it accurately positioned in a predetermined location. One of the portions includes electrical contacts which are electrically interconnected with the external leads. These contacts are positioned so as to engage preselected contact points on the wafer and establish electrical paths between the leads and the various regions of the wafer. The package is sealed by means that are effective to force the two portions of the package together during the sealing operation and to force the contacts on the wafer against the contacts on the package. Means are also provided to maintain the contact points on the wafer compressed into intimate electrical engagement with the contacts on the package after the package has been completely sealed.

These and other features and advantages of the present invention will become readily apparent from the following description of a limited number of embodiments thereof particularly when taken in connection with the accompanying drawings wherein like reference numerals refer to like parts and wherein.

Figures 1, 2, 3, 4, 5, 6, 7, 8, 9, 10:
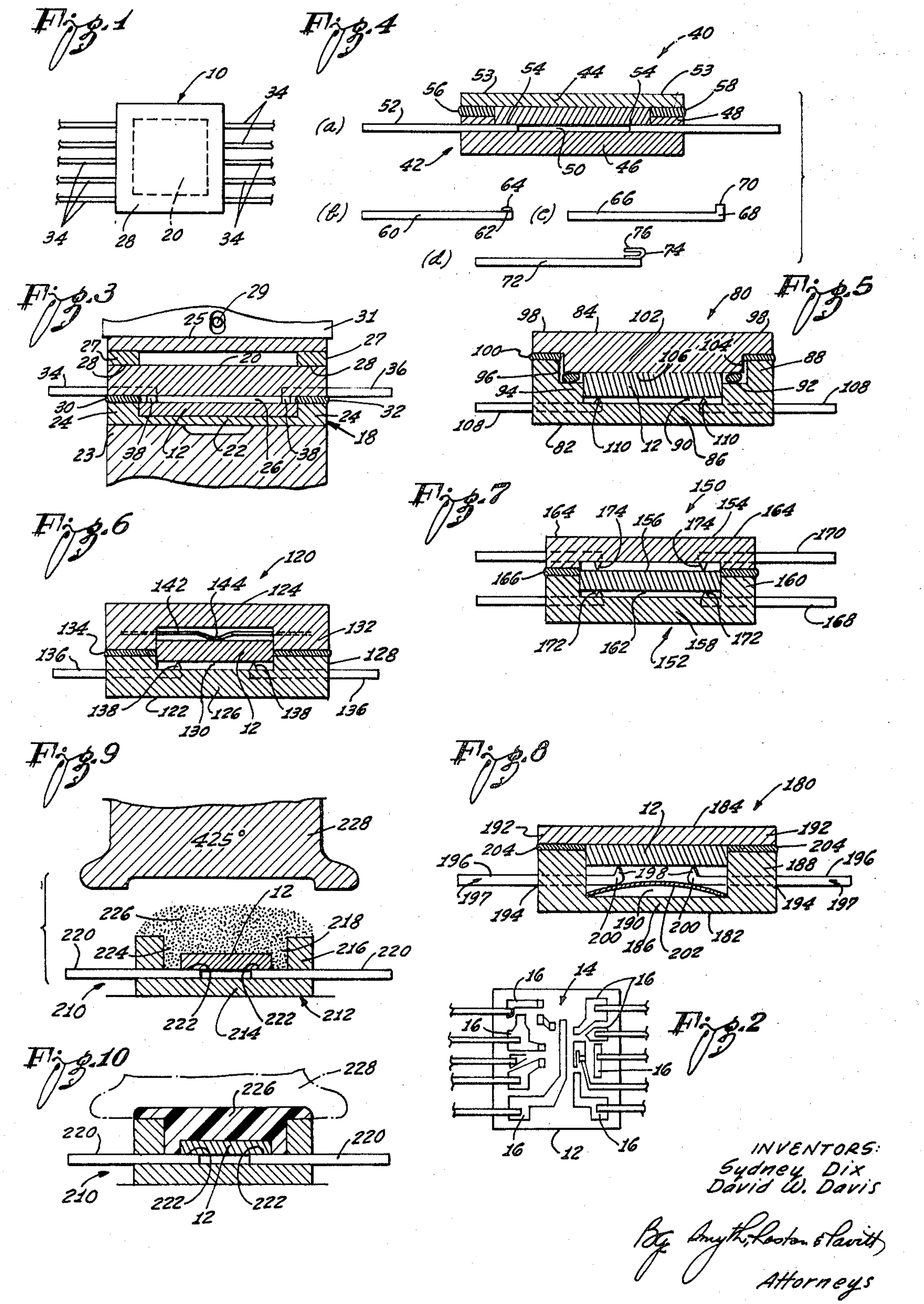
FIGURE 1 is a plan view of a micromodular package employing one embodiment of the present invention.
FIGURE 2 is a plan view, on an enlarged scale, of the semiconductive wafer sealed within the package of FIGURE 1.
FIGURE 3 is a cross-sectional view, on an enlarged scale, of the micromodular package taken substantially along the plane of the line in FIGURE 1.
FIGURE 4 is a cross-sectional view similar to FIGURE 3, but showing another form of the present invention.
FIGURE 5 is a cross-sectional view of a micromodular package employing another form of the present invention.
FIGURE 6 is a cross-sectional view of another micromodular package embodying another form of the present invention.
FIGURE 7 is a cross-sectional view of another micromodular package embodying another form of the present invention.
FIGURE 8 is a cross-sectional view of a micromodular package embodying another form of the present invention.
FIGURE 9 is a cross-sectional view of a sealing machine and a to-be-sealed micromodular package embodying another form of the present invention.
FIGURE 10 is a transverse cross-sectional view of the package of FIGURE 9 after it has been completely sealed.

Referring to the drawings in more detail, the present invention is particularly adapted to be embodied in a micromodular package 10 for hermetically sealing a circuit inside thereof. This circuit may be in the form of a thin film deposited on a suitable substrate. Alternatively, it may be an integrated circuit contained on a single semiconductive wafer. It should also be understood that the circuit may be a hybrid including a plurality of semiconductive wafers and/or a plurality of thin film circuits.

A semiconductive wafer 12 containing an integrated semiconductive circuit is shown in FIGURE 2. The wafer 12 includes a dice or chip of semiconductive material that acts as a substrate for the circuit. Although the wafer 12 may be made of any desired material, it will normally include silicon and will be on the order of about 0.005 inch thick. The integrated circuit may be laid down on the surface of the wafer by any of the well-known presently available techniques.

More particularly, a photo-chemical process employing various masks corresponding to the circuit are utilized to diffuse the various regions of the wafer and create a large number of semi-conductive components. At the same time, protective insulating layers, resistances, capacitors, etc. may also be formed and interconnected with each other. When this process has been completed, the wafer 12 may have a visible pattern formed thereon. This will constitute a complete integrated circuit 14.

At the same time the circuit 14 is being created, a plurality of electrical contacts 16 may be formed. These contacts 16 are interconnected with those portions of the circuit 14 that are to be connected with external circuitry.

Since the wafer 12 is easily contaminated, it has been found desirable for the wafer 12 to be hermetically sealed within a suitable protective housing or package 10. The specific size, shape and design of the package 10 will vary with the particular application and the configuration of the circuit 14 and may be of any desired variety. However, in the present instance, the package 10 is of the so-called micromodular flat pack variety. The width and length of the package 10 may be in a range on the order of a fraction of an inch up to several inches. The thickness of the package 10 may vary over a considerable range, but is normally on the order of a fraction of an inch.

The present package 10 includes a first or bottom housing portion 18 and a second or cover housing portion 20. These two housing portions 18 and 20 are hermetically bonded together to seal the wafer 12 inside.

The first or bottom portion 18 includes a base 22 having a length and width which corresponds respectively to the length and width of the finished micromodular package 10. Normally, the base 22 is only of sufficient thickness to provide sufficient structural rigidity to prevent damage to the circuit 14 and also insure the base 22 being impervious to the environment in which the package 10 will be used.

In addition, a plurality of sidewalls 24 are provided around the periphery of the base 22. The sidewalls 24 may be either formed integrally with the base 22 or may be a separate member which is attached to the base 22. The sidewalls 24 extend completely around the outside of the base 22 and do not have any openings or discontinuities therein. The exterior of the sidewall 24 is normally substantially aligned with the outer edges of the base 22 and accordingly will also have outside dimensions which are substantially identical to those of the base 22.

The sidewalls 24 project from the base 22 by an amount that is equal to or greater than the thickness of the wafer 12. As a result, the sidewalls 24 will be effective to at least partially define a space 26 for receiving the wafer 12. It has been found advantageous for the inside dimensions of the sidewall 24 to just barely exceed the outside dimensions of the wafer 12. The sidewalls 24 will thereby act as guides that will insure the wafer 12 being accurately seated in a precise location in the space 26. By way of example, the inside dimensions of the sidewalls 24 may be on the order of about one or two thousandths larger than the outside dimensions of the wafer 12.

The base 22 and sidewalls 24 may be formed in any desired material. By way of example, materials such as metal, glass and/or ceramic are particularly well suited for this type of package 10. The bottom portion 18 may be a single member with the base 22 and sidewalls 24 of a single material. For example, the bottom portion 18 may be molded out of glass or ceramic, etc. Alternatively, the base 22 and sidewalls 24 may be two separate members. For example, the base 22 may be a metal member and the sidewalls 24 may be glass or ceramic fused onto the periphery of the base 22. The cover 20 may be a substantially flat member of approximately uniform thickness having a periphery 28 adapted to register with and seat upon the sidewalls 24 whereby the cover 20 extends across the open space 26 and completely closes it.

In order to hermetically seal this space 26, the periphery 28 of the cover 20 may be bonded to the sidewalls 24. Although this bonding operation may be accomplished by any desired means it has been found that a sealing machine such as disclosed and claimed in copending application Ser. No. 337,081 filed Jan. 10, 1964 in the name of Sydney Dix is particularly well suited for this purpose. A sealing machine of this type includes a heat sink 23 that is adapted to engage the bottom portion 18. A ram 25 having a heating element 27 thereon is provided that may move toward and away from the heat sink 23. The element 27 is effective to generate a predetermined amount of heat when an electrical current flows therethrough whereby heat will be transferred into the package. Although the heating element is shown as being disposed above the package, it has been found desirable for the package to be inverted with the heating element 27 on the bottom and the heat sink 23 on the top whereby heat will flow upwardly through the periphery 28 toward the heat sink 23. The heat sink 23 controls the temperature of the wafer 12 during sealing. A recess may be provided in the sink 23 to assist in this control. The heating element 27 has a size and shape which corresponds to the size and shape of the periphery 28 of the cover portion 20. It may thus be seen that the heat from the element 27 will be concentrated in the region of the junction 30 between the periphery 28 and sidewalls 24.

A bonding material 32 such as a glass frit, solder, etc. may be disposed in the junction 30 so that it will be heated by the heat from the element 27. During the sealing operation, the heat will cause the bonding material to melt and become fluid. The pressure from the ram 25 will force the cover portion 20 toward the sidewalls 24. It should be noted that by pushing over a wide area like the periphery 28, the cover 20 will not become cocked.

After the bonding material 32 again solidifies, there will be a layer of bonding material 32 that hermetically bonds the cover 20 to the sidewalls 24. Alternatively, the cover portion 20 may include a material such as glass and this may be heated to a sufficient level to allow the cover 20 to be forced onto the bottom portion whereby the periphery 28 will be fused onto the sidewalls 24.

The various contacts 16 in the integrated circuit 14 may be interconnected with the outside circuitry by means of suitable electrical leads 34. Although these leads 34 may be provided on either portion 18 or 20 or both portions of the package, in the present embodiment, they are provided in the cover portion 20. The cover 20 may include an electrically non-conductive material such as glass or ceramic whereby the leads 34 may be molded into the cover 20 without producing any electrical shorting. Each lead 34 includes an outer section 36 that projects beyond the edge of the cover 20 for being interconnected with any desired external circuitry.

Each lead 34 also includes an inner end that is bent so as to project from the surface of the cover 20 and forms an electrical contact 38. These contacts 38 are disposed inside of the periphery 28 and accordingly will project into the space 26 when the periphery is bonded to the sidewalls 24. These contacts 38 are arranged in a set that corresponds to the set of electrical contacts on the wafer 12.

When the cover 20 is bonded onto the sidewalls 24, each of the contacts 38 on the cover 20 will come into intimate electrical engagement with a corresponding or registering contact 16 on the wafer 12. An electrically conductive path will thereby be formed between the integrated circuit 14 on the wafer 12 and the exposed portion 36 of the electrical leads so that the integrated circuit 14 may be electrically interconnected with the external circuitry.

It has been found desirable for the contacts 38 to be formed so as to all be in a common plane that is generally parallel to cover portion 20. By way of example, these contacts 38 may be machined, etched, etc. so as to be in such a plane.

In order to employ this embodiment, the wafer 12 is first inserted into the space 26 surrounded by the sidewalls 24 so as to rest on the base 22. Since there is very little if any clearance between the edges of the wafer 12 and the sidewalls 24, the wafer 12 and the contacts 16 thereon will be very precisely positioned. Following this, the cover portion 20 may be positioned on the sidewalls 24. Normally, a bonding material 32 such as a glass frit, solder preform, etc. is disposed in the junction 30 between the periphery 28 of the cover 20 and the sidewalls 24.

Heat and pressure is then applied to the to-be-sealed package 10 by the heating element 27 and ram 25. The heat will cause the bonding material to melt and to flow throughout all portions of the junction 30. During this interval, the pressure from the ram 25 will cause the two portions 18 and 20 to be compressed together. Since the bonding material 32 can flow, the two portions 18 and 20 will continue to move together until stopped by the set of electrical contacts 38 on the cover 20 coming into intimate engagement with the set of electrical contacts 16 on the wafer 12.

Since the ram 25 applies its pressure over the wide area formed by the periphery 28, the cover portion 20 will not become cocked. Instead, the cover will travel in translation toward the wafer 12. If the contacts 38 and contacts 16 are in parallel planes, all of the contacts will engage simultaneously. Since this condition is difficult to obtain at all times, it has been found desirable for the ram 25 to be carried by a pivot 29 on the lower end of a press 31. This will allow the cover 20 to move or twist slightly to insure all of the contacts 38 mating with the contacts 16.

The bonding material 32 is allowed to cool and solidify. The cover 20 will now be hermetically bonded onto the sidewalls 24 in a rigid fixed position. In addition, the registering electrical contacts 16 and 38 in the two sets will still be tightly compressed together, since the portions 18 and 20 form a compression means for the contacts. In order to energize the integrated circuit 14, the leads 14 may then be connected to a suitable external circuitry.

It may be seen that a micromodular package 10 has been provided without an operator laboriously manually bonding the wafer 12 in position and interconnecting the inner ends of the leads 14 with the contact points 16 on the wafer 12 by soldering or welding bonding wires therebetween. In addition, expensive equipment such as wafer bonding and wire bonding machines are eliminated.

It should further be noted that the wafer 12 is merely dropped into position without any wasted time or motion. However, the wafer 12 is always accurately positioned and there are no crossed electrical conductors. In addition, there are no fragile electrical bond wires that may break or short out.

As an alternative, the embodiment of FIGURE 4 may be employed. This embodiment may employ a package 40 which is similar to the first package 10 in that it includes a first or bottom housing portion 42 and a second or cover housing portion 44.

The first or bottom portion 42 includes a base 46 and a plurality of sidewalls 48 which extend around the periphery of the base 46 to at least partially define a space 50 for receiving the wafer 12. The inside dimensions of the sidewalls 48 are approximately equal to the outside dimension of the wafer 12. This will be effective to insure that the wafer 12 is very accurately positioned when it is disposed within the space 50.

The cover 44 may be a relatively flat member of substantially uniform thickness having a periphery 53 that is adapted to seat on the exposed surfaces of the sidewalls 48. This periphery 53 may be hermetically bonded to the sidewalls 48 by any suitable means such as by means of a bonding material 56 like a glass frit or solder, etc. As a result, the two portions may be bonded together to seal the wafer 12 inside.

In order to electrically interconnect the various contacts 16 on the wafer 12 with external circuitry, electrical leads 52 are provided which extend through the package 40. In the present instance, these leads 52 are disposed in the bottom portion 42 and extend through the sidewalls 48 and/or base 46 so that the outer ends of the lead 52. All of the contacts 54 should be disposed The inner ends of the leads 52 are disposed just inside of the sidewalls 48 and immediately adjacent to or slightly above the surface of the base 46. These inner ends form a set of electrical contacts 54 which are disposed inside of the space 50 immediately adjacent to the wafer 12. These contacts 54 are arranged in a pattern which is substantially identical to the arrangement of the set of contacts 16 on the wafer 12. It will thus be seen that when the wafer 12 is disposed in the space 50, the sidewalls 48 will position the wafer 12 so that each contact 16 on the wafer 12 will register with a contact 54 on the inner end of the lead 54. All of the contacts 54 should be disposed in a common plane whereby they will engage all of the contacts 16 on the wafer 12. If the leads 52 cannot be positioned with sufficient accuracy for this purpose, the contacts 54 may be machined, etched or otherwise formed into the desired plane.

In order to employ this embodiment, the wafer 12 is first positioned in the space 50 so that the electrical contacts 16 thereon are in electrical engagement with the contacts 54 formed by the inner ends of the leads 52. Following this, the cover 44 is placed in position on the sidewalls 48 with a suitable bonding material 56 such as a glass frit, solder, etc. being disposed in the junction 58 between the periphery 53 and the sidewalls 48. A suitable quantity of heat and pressure is then applied by suitable means such as the heating element 27 on the ram 25 to the package 40. This will melt the bonding material 56 and force the periphery 53 of the cover portion 44 toward the sidewalls 48. During this motion, the center of the cover 44 will engage the back of the wafer 12 and force it down onto the ends of the leads 52. Once the bonding material 56 again hardens, the cover 44 and base 46 act as compression means to force the wafer 12 toward the base 46 and maintain the electrical contacts 54 on the wafer 12 firmly compressed against the contacts 54 formed by the inner ends of the leads 52. Since the cover 44 is in intimate contact with the surface of the wafer 12, it will absorb heat and keep the wafer 12 whereby the circuit 14 can handle large amounts of power.

Under some circumstances, it may be desirable to employ leads 52 similar to those in FIGURE 4*b*. These leads 60 are very similar to the preceding leads 52. However, a small bead 62 is secured on the end so as to form an enlarged contact 64. This bead 62 may have a surface of any desired shape that will insure an intimate electrical engagement with the contacts 16 on the wafer 12. By way of example, the bead 62 may have a spherical surface. The bead 62 may include a material that is relatively soft. As a result, the contact 64 will deform slightly when the cover is forced down. This will insure all of the contacts 16 being engaged by the contacts 64. It has also been found desirable for the bead 62 to include a material that is the same as contact 16. This will eliminate the "purple plague" which is an electrolytic action produced by mating contacts of dissimilar metals.

Alternatively, the lead 66 of FIGURE 4*c* may be employed. This lead 66 includes a portion 68 on its inner end which is bent at right angles so as to project outwardly into the space 50 and form a contact 70 for engaging the contact 16 on the wafer 12.

Alternatively, the lead 72 of FIGURE 4*d* may be employed. This lead 72 is very similar to the preceding leads. However, a resilient member such as a small spring clip 74 is employed to form a contact 76. One end of the clip 74 bears on the exposed inner end of the lead 72 while the other end bears against the contact 16 on the wafer 12. It will be seen that when using a resilient contact of this type, the spring clip 74 acts as an additional compression means so as to maintain the compression between the contact 16 on the wafer 12 and the inner end of the lead 72. As a consequence, substantially uniform pressures will be assured between each pair of registering contacts 76. In addition, in the event there is any mispositioning of the contacts 16 or 76 resulting from warping of the package or wafer, variations in thicknesses, etc., the clip 74 will expand or contract and accept the variations. As a result, a compelete electrical circuit will be assured.

As a further alternative, the embodiment of FIGURE 5 may be employed. This embodiment is similar to the preceding embodiments in that it also includes a micromodular package 80 having a first or bottom portion 82 and a second or cover portion 84 which are hermetically bonded together to seal the wafer 12 inside.

The first or bottom portion 82 includes a base 86 and a plurality of sidewalls 88 which extend around the periphery of the base 86 so as to at least partially define a space 90 suitable for receiving the wafer 12. Each of the sidewalls 88 may include a shoulder 92 which divides the sidewall 88 into two separate sections 94 and 96. The first section 94 has an inside surface substantially equal to or slightly larger than the outside dimensions of the wafer 12. This will act as a guide and be effective to precisely position the wafer 12.

The cover 84 includes a periphery 98 which is adapted to be seated on the exposed portion of the sidewall 88 and be hermetically bonded thereto by means of a bonding material 100 such as a glass frit, solder, etc. In addition, the cover 84 includes a center projection 102 which extends above the periphery 98 so as to form a shoulder 104. This shoulder 104 is adapted to just fit inside of the second section 96 of the sidewall 88. The center of the projection 102 also includes a surface 106 which is effective to engage the back side of the wafer 12 and compress it into the space 90.

In order to interconnect the various portions of the integrated circuit 14 with external circuitry, suitable electrical leads 108 may be provided. These leads 108 may be embedded in the bottom portion 82 and extend therethrough so as to leave an exposed outer section of the lead 108. The inner ends of the leads 94 project upwardly through the base 86 so as to form a set of contacts 110. Although these contacts 110 may be similar to any of the preceding contacts, in the present instance, the ends of the lead 108 are tapered whereby the contacts 110 will be pointed. These contacts 110 are precisely aligned with the registering contacts 16 on the wafer 12 and are adapted to become embedded in the contacts 16.

In order to employ this embodiment, the semiconductive wafer 12 is inserted into the space 90 so that the contacts 16 thereon will rest on the contacts 110 formed by the leads 108. Following this, the cover 84 is placed on the bottom portion 82 so that the surface 106 on the projection 102 will be in intimate contact with the wafer 12. Following this, heat and pressure are applied to the package 80. The heat will be effective to melt the bonding material 100 to a sufficient degree to allow it to flow throughout the junction between the cover 84 and sidewalls 88. The bonding material 100 may also be provided on the shoulder 92. This material will also melt and tend to flow around the shoulder 92 and the mating portion of the cover 84 and assists in sealing the cover 84 in position. Also, this bonding material will tend to flow over and around the wafer 12 and retain it in position. The pressure will be effective to force the cover 84 toward the bottom portion 82, and when the bonding material cools, the cover 84 and the bottom portion act as compression means. Since the projection 102 engages the back of the wafer 12, the contacts 110 will become embedded in the contact 16 on the wafer 12. This will establish an intimate electrical circuit between the contacts 16 and 110. It can be appreciated that in the event some of the contacts 16 or 110 are out of position, the amount of penetration of the contacts 110 into the contacts 16 will vary. The amount of these variations will be a sufficient magnitude to insure all of the mating contacts 16 and 110 being intimately engaged.

As a further alternative, the embodiment of FIGURE 6 may be employed. This embodiment also employs a micromodular package 120 having a first or bottom portion 122 and a second or cover portion 124 bonded together to seal the wafer 12 inside. The first or bottom portion 122 includes a base 126 and a sidewall 128 that extends therearound to at least partially define a space 130 for receiving the wafer 12. The second or cover portion 124 may be flat and of substantially uniform thickness similar to the preceding covers. However, in the present instance, it also includes a sidewall 132. The sidewall 132 extends around the periphery of the cover portion 124 so as to mate with the sidewalls 128 on the bottom portion 122. The sidewalls 128 and 132 on the two portions 122 and 124 may be bonded to each other by means of a suitable bonding material 134 such as glass frit, solder, etc.

To interconnect the circuit 14 on the wafer 16 with suitable external circuitry, electrical leads 136 may be provided. In the present instance, these leads 136 are in the bottom 122 so as to project from the sides of the package 120. The inner ends of the leads 136 are tapered to form pointed contacts 138 that project upwardly into the space 130. All of these contacts 138 are positioned so as to mate with a registering contact 16 on the wafer 12.

In order to insure a perfect electrical contact, it has been found desirable to employ means effective to bias or force the wafer 12 against the contacts 138 on the bottom portion 122. In the present instance, this is accomplished by means of a resilient member such as a leaf spring 142. The opposite ends of the spring 142 are embedded in the sidewalls 132. The center of the spring 142 includes a deformation 144 or resilient section which projects into intimate contact with the center of the wafer 12 to exert a resilient force thereon.

It will be seen that the spring 142 will be effective to resiliently bias the wafer 12 so that all of the contacts 16 will be forced against the contacts 138 formed by the electrical leads 136. As a consequence, if there is any misalignment of the various contacts 16 or 138 such as might result from a warpage of the package 120 or wafer 12, the spring 142 will be effective to maintain them in intimate electrical contact.

This package 120 is prepared by first placing the wafer 12 face down on the bottom portion 122. The contacts 16 will now rest on the contacts 138. The bonding material 134 and cover portion 124 are then placed on top of the sidewalls 128. Heat and pressure are then applied so as to melt the bonding material 134 and force the cover portion 124 toward the bottom portion 122. As this motion progresses, the spring 142 will become more highly compressed until all of the contacts 138 are embedded in all of the contacts 16.

As a further alternative. the embodiment of FIGURE 7 may be employed. This embodiment employs a micromodular package 150 having a first or bottom portion 152 and a second or cover portion 154. These two portions 152 and 154 are adapted to be hermetically bonded together so as to seal a semiconductive wafer 156 inside thereof. The first or bottom portion 152 includes a base 158 and a sidewall 160 that extends therearound so as to at least partially define a space 162 for receiving the wafer 156. The cover or second portion 154 includes a periphery 164 which is adapted to seat on the sidewall 160. A suitable bonding material 166 such as the glass frit or solder, etc. may be provided between the periphery 164 and the sidewall 160 for securing the two portions 152 and 154 together by means of a hermetic seal.

The semiconductive wafer 156 may be substantially identical to the wafer 12 employed in the preceding embodiments. However, it has been found desirable to employ the wafer 156 having separate integrated circuits on both sides of the wafer 156. These circuits may be laid down on both sides of the wafer 156 similar to the circuit 14 on the wafer 12. This permits a greater amount of circuitry to be incorporated onto a single semiconductive wafer. It also permits a certain amount of independence between the two different circuits. Each of these circuits includes a set of electrical contacts adapted to be interconnected with suitable external circuitry. These contacts will thus be disposed on the opposite sides of the wafer 156 and are arranged in predetermined patterns.

In order to interconnect the contacts in both of these sets with external circuitry, suitable electrical leads may be provided in one or both portions 152 and 154 of the package 150. More particularly, in the present instance, a set of electrical leads 168 are provided in the bottom portion 152 and a set of leads 170 are provided in the upper portion 154. There will thus be two layers of leads projecting from the opposite sides of the package 150. The inner end of each lead 168 and 170 includes a contact 172 or 174 which projects from its respective portion into the space 162 formed between the two portions 152 and 154. The contacts 172 and 174 are positioned to register with the corresponding contacts on the wafer 156.

In order to employ this embodiment, the wafer 156 may be placed in the space 162 formed inside of the bottom portion 152. The contacts on the wafer 156 will be in intimate engagement with the contacts 172 on the bottom portion 152. Following this, the cover portion 154 is placed on the bottom portion 152 with a layer of bonding material 166 disposed therebetween. The contacts 174 on the cover 154 are positioned so as to register with and engage the contacts on the second side of the wafer 156. Following this, heat and pressure are applied to the portions 152 and 154. The heat will melt the bonding material 166 to a sufficient degree to allow it to flow. The pressure is effective to force the bonding material 165 throughout the junction and cause the cover 154 to move toward the bottom portion 152. This movement will continue until all of the contacts 172 and 174 on the cover and bottom portions are firmly embedded in the contacts on the opposite sides of the wafer 156. The bonding material 166 is then allowed to cool whereby the cover 154 is securely bonded onto the bottom portion 152 and forms a compressive means to maintain the contacts in engagement.

As a further alternative, the embodiment of FIGURE 8 may be employed. This embodiment is similar to the preceding embodiments in that it includes a micromodular package 180 having a first or bottom portion 182 and a second or cover portion 184 which may be hermetically bonded together to seal the wafer 12 inside thereof.

The first or bottom portion 182 includes a base 186 having a sidewall 188 that extends around the base 186 to at least partially define a space 190 for receiving the semiconductive wafer 12. The cover 184 includes a periphery 192 that mates with the sidewall 188 so as to be bonded thereto by means of a suitable bonding material 204 such as a glass frit or solder, etc.

In order to interconnect the various portions of the integrated circuit 14 on the semiconductive wafer 12 with external circuitry, electrical leads 197 are provided which extend through the sidewalls 188 of the package 180 to leave exposed outer portions 196. The inner ends 200 of the leads 194 project into the space 190 and form contacts 198. Each contact 198 is positioned to register with and electrically engage the corresponding contact 16 on the semiconductive wafer 12. The contacts 198 may be pointed to permit them being forced into the contacts 16 of the wafer 12.

The inner ends of the leads 197 and the contacts 198 are spaced from the surrounding structure and particularly the base 186. The inner ends 200 of these leads will thereby form a cantilever that is supported by the portion of the lead 197 embedded in the sidewall 188. This will provide a predetermined amount of resilience for the contacts 198 that will allow them to be deflected over a limited distance.

It may be seen that if there is a distortion or misalignment of some of the contacts 16 and/or 198, the contacts 198 may be deflected a sufficient distance to accept this misalignment.

In the event it is desired to increase the amount of resiliency of the various leads 197, it may be desirable to provide a backup spring 202 constructed of an insulating material or similar device between the various inner ends 200 and the base 186.

In order to use this embodiment of the invention, the semiconductive wafer 12 is first placed face down in the bottom portion 182. The contacts 16 on the wafer 12 will rest on the contacts 198. The cover 184 is then placed in position on the sidewalls 188 with suitable bonding material 204 disposed between the periphery 192 and the sidewalls 188. Heat and pressure are then applied. The heat will melt the bonding material 204 and the pressure will force the cover 184 and the wafer 12 in contact therewith against the contacts 198. The contacts 198 will be deflected a limited distance from their free position due to the compressive force produced by the cover 184 and bottom portion 182 and the contacts 198 will become embedded in the contacts 16. This will insure a complete and positive interconnection between all of the contacts 16 and 198.

It should be noted that since the inner ends 200 may be deflected over a considerable distance, the contacts 16 and 198 may all be in intimate and positive contact prior to the time the cover 184 is compressed into position during the bonding operation. As a result, the amount of travel of the cover 184 may be very small.

As a further alternative, the embodiment of FIGURES 9 and 10 may be employed. This embodiment differs from the preceding embodiments in that it employs a one-piece package 210 for sealing the semiconductive wafer 12. More particularly, this package 210 includes a bottom portion 212 having a base 214 with a sidewall 216 that extends therearound to at least partially define a space 218 for receiving the semiconductive wafer 12. Suitable electrical leads 220 are provided that extend through this portion so as to form a set of contacts 222. These contacts 222 are positioned to register with the contacts 16 on the wafer 12.

The wafer 12 is bonded or sealed into the package by means of a suitable bonding material 224 which directly overlays the wafer 12 and fills the space 218 inside of the package 210. This bonding material may be of any desired variety such as a glass frit, etc.

This package 224 is assembled by first placing the wafer 12 inside of the bottom portion 212 face down. The contacts 16 are now in electrical engagement with the contacts 222. Following this, the bonding material 224 is loaded onto the bottom portion 212 so as to completely fill the space 218. The material 224 should be in sufficient quantity to form a mound 226 that projects above the rest of the package 210. Following this, a heater such as a hot mandrel or press 228 is forced downwardly onto the top of the mound 226 with a substantial amount of pressure. The mandrel 228 is effective to supply a sufficient amount of heat to melt the bonding material 224 to a degree where it will flow.

The pressure from the press or mandrel 228 will cause the fluid bonding material 224 to flow around the wafer 12 and overlay the sidewalls 216. The amount of pressure is also great enough to simultaneously force the contacts 16 on the wafer 12 into intimate electrical engagement with the contacts 222 formed by the inner ends of the leads 220.

The bonding material 224 is then allowed to cool and solidify into a hardened mass before the pressure is released. The bonding material 224 acts as a compression means to maintain the contacts 16 on the wafer 12 compressed against the contacts 222 on the inner ends of the leads 220 to maintain a good electrical contact therebetween.

Figure 11:
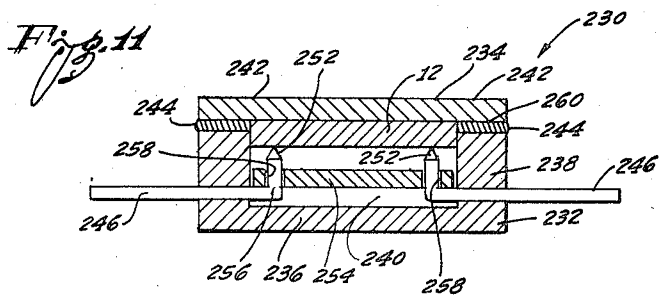
FIGURE 11 is a cross-sectional view of another micromodular package embodying another form of the present invention.

As an alternative, the embodiment of FIGURE 11 may be employed. This embodiment may employ a micromodular package 230 which is similar to the package 40 in FIGURE 4. The package 230 includes a first or bottom portion 232 and a second or cover portion 234.

The first or bottom portion 232 includes a base 236 and a plurality of sidewalls 238 which at least partially define a space 240 for receiving the wafer 12. The cover 234 may be a relatively flat member of substantially uniform thickness having a periphery 242 that is adapted to seat on the exposed surfaces of the sidewalls 238 and become hermetically bonded thereto by any suitable bonding material 244.

A plurality of leads 246 are disposed in the bottom portion 232 and extend through the sidewalls 238 into the space 240 immediately adjacent to or slightly above the inner surface of the base 236. These inner ends 256 form a set of electrical contacts 252 which are positioned to engage the contacts 16 on the wafer 12. It will thus be seen that when the wafer 12 is disposed face down in the space 240, the sidewalls 238 will position the wafer 12 so that each contact 16 on the wafer 12 will register with a contact 252 on the inner end of the lead 246.

In some instances, the contacts 16 on the wafer 12 are very small and that the contacts 252 on the ends of the leads 246 must also be small and very accurately positioned. If the contacts 252 are not accurately positioned and/or are too large, they may engage the wrong part of the circuit 14 and short it out or completely miss the contact 16.

To avoid the foregoing difficulty, an alignment plate 254 is disposed over the inner ends 256 of the leads 246. This plate 254 includes a plurality of openings 258 that are precisely positioned with a high degree of accuracy. This will be effective to very precisely align the contacts 252 so that they will engage the contacts 16.

To seal this embodiment, the plate 254 is first positioned on the inner ends 256. Following this, the wafer 12 is placed face down in the space 240 so that the electrical contacts 16 will rest on the electrical contacts 252 formed by the inner ends 256 of the leads 246. Following this, the cover 234 is placed in position on the sidewalls 238 with a suitable bonding material 258 such as a glass frit, solder, etc. being disposed in the junction 260. A suitable quantity of heat and pressure is then applied to the package 230 so as to melt the bonding material 258 and force the periphery 242 of the cover 234 toward the sidewalls 238. During this motion, the center of the cover 234 will engage the back of the wafer 12 and force it down onto contacts 252. Since the guide plate 254 retains the contacts 252 accurately positioned, electrical circuits will be maintained between all of the registering contacts 16 and 252. The cover 234 and the base 236 form a compression means to maintain the contacts in electrical engagement.

Figure 12:
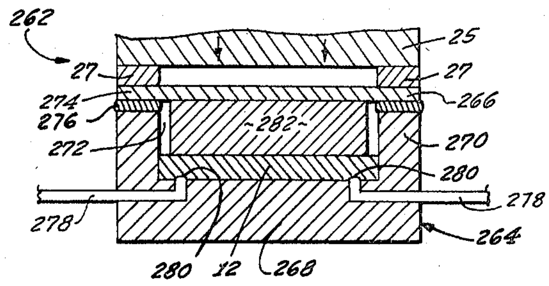
FIGURE 12 is a cross-sectional view of another micromodular package embodying another form of the present invention.

As a further alternative, the embodiment of FIGURE 12 may be employed. This embodiment is similar to the preceding embodiments in that it also includes a micromodular package 262 having a first or bottom portion 264 and a second or cover portion 266 which are hermetically bonded together to seal the wafer 12 inside.

The first or bottom portion 262 includes a base 268 and a plurality of sidewalls 270 which extend around the periphery of the base 268 so as to at least partially define a space 272 suitable for receiving the wafer 12. The sidewalls 270 have a height that is considerably greater than the thickness of the wafer 12. As a result, the wafer 12 may be completely disposed inside of the space 272 with the top of the sidewalls 270 projecting thereabove. The cover 266 includes a periphery 274 which is adapted to be seated on the top of the sidewall 270 and be hermetically bonded thereto by means of a bonding material 276 such as a glass frit, solder, etc.

In order to interconnect the various portions of the integrated circuit 14 with external circuitry, suitable electrical leads 278 are embedded in the bottom portion 264 and extend therethrough so as to leave exposed outer sections of the leads 278. The inner ends of the leads 278 project upwardly through the base 268 so as to form a set of contacts 280. Although the inner ends may project a substantial distance above the surface of the base 268, is has been found desirable for the contacts 280 to be substantially flush with or only slightly above the surface of the base 268.

To seal this package 262, the semiconductive wafer 12 is first placed face down in the space 272 so that the contacts 16 thereon will rest on the contacts formed by the leads 278. This will cause the face of the wafer 12 to be very close to the surface of the base 268.

Following this, a spacer 282 is placed on the back of the wafer 12 so that it will project slightly above the tops of the sidewalls 270. The cover 226 is placed on the top of the spacer 282 with the periphery 274 aligned with the sidewalls 270. Heat and pressure are then applied to the package 262 by the heating element 27 and ram 25. The bonding material 276 is thereby heated to a sufficient degree to melt it and allow it to flow throughout the junction between the periphery 274 and sidewalls 270.

The pressure will be effective to force the cover 266 against the spacer 282. Since the spacer 282 engages the back of the wafer 12, the contacts 280 will become embedded in the contact 16 on the wafer 12. This will establish an intimate electrical circuit between the contacts 16 and 280. It can be appreciated that in the event some of the contacts 16 or 280 are out of position, the amount of penetration of the contacts 280 into the contacts 16 will vary. The amount of these variations will be a sufficient magnitude to insure all of the mating contacts 16 and 280 being intimately engaged.

The spacer 282 serves several functions. First, it permits the sidewalls 270 to be built up to a greater height and insures the wafer 12 being forced onto the contacts 280. Also, the spacer 282 separates the wafer 12 from the heating element 27. This will facilitate keeping the wafer 12 cool during the sealing operation. The spacer 282 is also in intimate heat exchanging relation with the wafer 12. As a result, it will absorb large amounts of heat from the wafer 12. The combination of the high rate of heat transfer from the wafer 12 into the base 268 and spacer 282 will greatly increase the amount of power that can be handled by the circuit 14. The spacer also acts as part of the compression means to maintain the contacts in electrical engagement.

Figure 13:
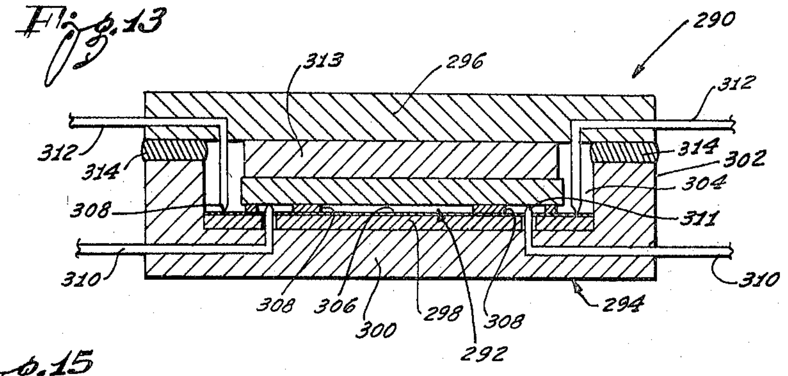
FIGURE 13 is a cross-sectional view of another micromodular package embodying another form of the present invention.

As a further alternative, the embodiment of FIGURE 13 may be employed. This embodiment also employs a package 290 which is adapted to seal a so-called hybrid circuit 292. Such a circuit includes an integrated semiconductive circuit on a semiconductive wafer and a thin film circuit on a substrate.

The package 290 includes a first or bottom housing portion 294 and a second or cover housing portion 296 that are bonded together to seal the wafer 12 and substrate 298 inside thereof. The first or bottom portion 294 includes a base 300 and a sidewall 302 that extends therearound to at least partially define a space 304. The second or cover portion 296 may be substantially flat and of uniform thickness similar to the preceding covers.

The substrate 298 contains a thin electrically conductive film that is arranged to form an electrical circuit 306 having contacts 308. The substrate 298 is placed face up in the bottom of the space 304.

The thin film circuit 306 includes a plurality of electrically conductive films that are provided on the surface of the substrate 298 by any suitable means such as a vapor deposition. These are arranged to form various components such as resistors, capacitors, etc. The components may be electrically connected with each other or may be separate for being interconnected with a circuit such as the integrated circuit 14 by means of the contacts 308.

The wafer 12 is disposed face down on the substrate 298 so that the circuit 14 is adjacent the circuit 306. Suitable contacts 16 and 308 are provided on the face of the wafer 12 and substrate 298 for interconnecting the circuit 14 and the components. These contacts 16 and 308 are greatly exaggerated in the drawings for purposes of illustration. Normally, they will merely be exposed electrically conductive surfaces which register with each other for being compressed together.

To interconnect the circuit 14 on the wafer 16 and/or the thin film circuit 306 on the substrate 298 with suitable external circuitry, electrical leads 310 and 312 may be provided in the bottom 294 and/or the top 296 so as to project from the outside of the package 290. The inner ends of the leads 310 project upwardly into the space 304 and mate with a registering contact 16 on the wafer 12. The inner ends of the leads 312 project downwardly into the space 304 and engage contacts 308 on the substrate 298. It should be understood that the circuits 14 and 306 on the wafer 12 and/or substrate 298 may be arranged so that all of the contacts are on one member.

This package 290 is prepared by first placing the substrate 298 in the space 304 face up and then placing the wafer 12 face down on the substrate 298. The contacts 16 will now rest on the contacts 308 and the integrated circuit 14 will be connected to the thin film circuit 306. Following this, a spacer 313 and the cover 296 are placed on the package 290. Heat and pressure are then applied so as to melt the bonding material 314 and force the cover portion 296 and spacer 312 toward the bottom portion 294. As this motion progresses, the wafer 12 and substrate 298 and all of the mating contacts will be compressed together. The cover 296 and the bottom portion act as a compression means in combination with the spacer 313.

Figure 14:
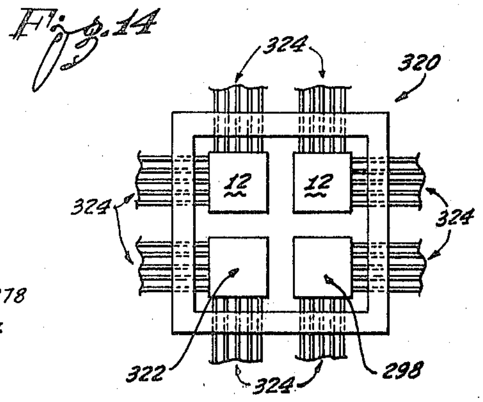
FIGURE 14 is a cross-sectional view of another micromodular package embodying another form of the present invention.

As a further alternative, the embodiment of FIGURE 14 may be employed. This embodiment employs a micromodular package 320 which may be similar to any of the embodiments disclosed herein. This package 320 is hermetically sealed so as to protect a hybrid circuit 322 including a plurality of semiconductive wafers 12 and/or of thin film substrates 298. A plurality of electrical leads 324 are provided so as to extend into the package 320 and form a plurality of contacts that are compression connected to mating contacts on the wafers and/or substrates in a manner previously described.

Figure 15:
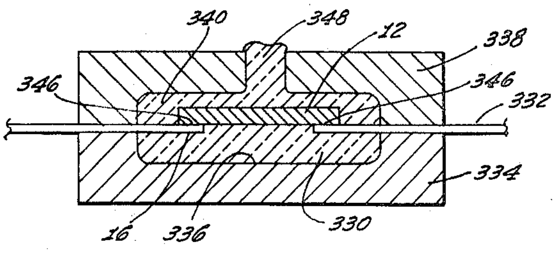
FIGURE 15 is a cross-sectional view of a sealing machine and a micromodular package being sealed by the machine and embodying another form of the present invention.

As a further alternative, the embodiment of FIGURE 15 may be employed. This embodiment differs from the preceding embodiments in that it does not employ a previously formed package for sealing the semiconductive wafer 12.

The wafer 12 is bonded or sealed into a package 330 by means of a suitable bonding material such as a glass, ceramic, etc. which completely surrounds the wafer 12 and the ends of the electrical leads 332.

The leads 332 and wafer 12 are first placed on a mold 334 having a cavity 336. Following this, a second mold 338 having a cavity 340 is positioned on the first mold 334. The wafer 12 is now disposed in the cavities 336 and 340 with the contacts 16 resting on the inner ends 346 of the leads 332. Following this, a suitable bonding material 348 such as molten glass or ceramic, etc. is forced into the cavities 336 and 340 under a substantial pressure. This will cause the bonding material 348 to completely encase the wafer 12 and leads 332 and act as a compression means to compress the contacts 16 and 346 together. After the bonding material 348 has cooled and hardened, it may be removed from the molds 334 and 338. The wafer 12 will now be completely encased in the bonding material 348 with all of the contacts 16 and 346 compressed together.

It may be seen that the present invention provides a simplified micromodular package for housing integrated circuits and that the necessity for wafer bonding and wire bonding have been eliminated. This has been accomplished by means of a mechanical interconnection of the various contacts and by maintaining the various portions of the package and mating contacts compressed together.

Although only a limited number of embodiments of the present invention are disclosed herein, it will be readily apparent to persons skilled in the art that numerous changes and modifications may be made thereto without departing from the invention. For example, the construction of the various portions of the package, the electrical contacts on the wafer and package and the means by which the contacts are maintained compressed together may be varied as well as the other details of the structure and the methods of fabricating the same. Accordingly, the foregoing disclosure and description of the present invention are for illustrative purposes only and do not in any way limit the present invention which is defined only by the claims which follow.

What is claimed is:

1. A package for sealing circuits therein, including the combination of:

a first housing member and a second housing member and with said housing members secured together to form an enclosed sealed space, a support member, disposed within said enclosed space, an electrical circuit on said support member, a first set of electrical contacts disposed in a predetermined pattern on the support member and with the first set of electrical contacts interconnected with the electrical circuit, a second set of electrical contacts arranged in said predetermined pattern and with the electrical contacts in the second set positioned to register with the electrical contacts in the first set and with said second set of electrical contacts forming electrical leads extending from within said enclosed space to positions external of said enclosed space, and said first housing member and second housing member connected together to form compression means effective to maintain the electrical contacts in the first set physically compressed against the electrical contacts in the second set and to provide an electrical engagement between the electrical contacts in the first set and the electrical contacts in the second set, said compression means being the sole means providing engagement of said contacts.

2. A flat package of the class described, including the combination of:

a pair of flat housing members secured together by a continuous wall member to form an enclosed space, at least one semiconductive wafer disposed in said enclosed space, an electrical circuit on said semiconductive wafer, a first set of electrical contacts disposed on said semiconductive wafer in a predetermined pattern, said first set of electrical contacts being electrically interconnected with predetermined portions of said electrical circuit, a plurality of electrically conductive members forming a second set of electrical contacts and with the second set of electrical contacts disposed in said predetermined pattern to register with corresponding contacts in the first set and with said plurality of electrically conductive members extending through said wall member to form conductive leads, and said housing members connected together to form compression means effective to force and maintain the contacts in the first set into electrical engagement with the contacts in the second set said compression means being the sole means providing engagement of said contacts.

3. A flat package of the class described, including the combination of:

first and second flat housing members secured together to form a flat package, a semiconductive wafer disposed between said housing members and with said semiconductive wafer having an electrical circuit thereon and with said electrical circuit including a first set of electrical contacts, a plurality of electrically conductive members extending through at least one of said housing members to form a second set of electrical contacts and with the contacts in the second set being disposed in electrical engagement with the contacts in the first set, and said first and second housing members forming, means effective to force the semiconductive wafer and electrically conductive members toward each other to maintain a compressive force between the contacts in the two sets said means being the sole means providing engagement of said contacts.

4. A package of the class described, including the combination of:

a first flat housing member and a second flat housing member, said housing members being secured together, a semiconductive wafer disposed between said housing members and with the semiconductive wafer having an electrical circuit thereon, a first set of electrical contacts disposed in a predetermined pattern on said semiconductive wafer and with the first set of electrical contacts electrically interconnected with said circuit, a plurality of electrical leads extending through at least one of said housing members and with the inner ends of said electrical leads forming a second set of electrical contacts disposed in said predetermined pattern and with the second set of electrical contacts in engagement with the contacts in the first set, and spring means in at least one set of contacts, said spring means being compressed by the secured housing means to maintain the electrical contacts in the two sets in physical contact, said first and second housing members being the sole means maintaining engagement of said contacts.

5. A package of the class described, including the combination of:

a first flat housing member and a second flat housing member and with said housing members being secured together, a semiconductive wafer disposed between said housing members and with the superconductive wafer having an electrical circuit thereon, a first set of electrical contacts electrically interconnected with said electrical circuit, a second set of cantilever contacts on at least one of said housing members and with the cantilever contacts in the second set being disposed in electrical engagement with the contacts in the first set, and said housing members connected together to form means effective to force the wafer toward the second set of contacts and to maintain the contacts in said first and second sets compressed together said means being the sole means maintaining engagement of said contacts.

6. A package of the class described, including the combination of:

first and second flat housing members secured together, a semiconductive wafer disposed between said housing members and with the semiconductive wafer having an electrical circuit thereon, a first set of electrical contacts electrically interrconnected with said electrical circuit, a second set of electrical contacts extending through at least one of said housing members and with the contacts in the second set disposed in electrical engagement with the contacts in the first set, the contacts in the second set being shaped to become embedded in the contacts in the first set, and said housing members connected together to form means effective to compress the two sets of contacts together and to maintain the contacts in the second set embedded in the contacts in the first set said first and second housing members being the sole means proving engagement of said contacts.

7. A package of the class described, including the combination of:

a first housing member having a flat base and a plurality of sidewalls arranged to at least partially define a space, a second housing member having a periphery registering with said sidewalls, a bonding material disposed between the sidewalls and periphery to seal the second housing member to the first housing member, a semiconductive wafer disposed in said space and having an electrical circuit thereon, a first set of electrical contacts on said wafer positioned in a predetermined pattern and being electrically interconnected with said circuit, and a plurality of electrical leads extending through one of said housing members and into said space, the inner ends of said leads forming electrical contacts arranged in said pattern and engaging the contacts in the first set of contacts, said bonding material initially deformable to allow the two housing members to form a compressive means to force the contacts in said sets into electrical engagement with each other and with said bonding material after sealing maintaining the compressive force produced by the two housing members said compressive means being the sole means maintaining engagement of said contacts.

8. A package of the class described, including the combination of:

a first housing member having a flat base and a plurality of sidewalls arranged to at least partially define a space, a second housing member secured to said sidewalls and extending across and sealing said space, a semiconductive wafer disposed in said space, said sidewalls being effective to maintain said wafer in a predetermined position on the first housing member, a first set of electrical contacts on said wafer positioned in a predetermined pattern, a plurality of electrically conductive members extending through one of said housing members and forming a second set of electrical contacts in said space and arranged in said predetermined pattern, and said housing members connected together to form compression means effective to compress the contacts in one of the sets against the contacts in the other set, said first and second housing members being the sole means providing engagement of said contacts.

9. A package of the class described, including the combination of:

a first housing member, a second housing member secured to the first housing member to form a sealed space therebetween, a semiconductive wafer disposed in said space and having an electrical circuit thereon, a first set of electrical contacts on one side of said wafer positioned in a first predetermined pattern and being electrically interconnected with said circuit, a second set of electrical contacts on the opposite side of said wafer and being arranged in a second predetermined pattern and being electrically interconnected with said circuit, a third set of electrical contacts on the first housing member arranged in the first predetermined pattern and engaging the contacts in the first set, a fourth set of electrical contacts on the second housing member arranged in the second predetermined pattern and engaging the contacts in the second set, and said housing members connected together to form compression means effective to maintain the registering contacts compressed together, said first and second housing members being the sole means providing engagement of said contacts.

10. A package of the class described, including the combination of:

a first housing member and a second housing member, said housing members being secured together, a semiconductive wafer disposed between said housing members and having an electrical circuit thereon, a first set of electrical contacts on said wafer electrically interconnected with said circuit and arranged in a predetermined pattern, a second set of electrically conductive members extending through one of said housing members, said electrically conductive members forming a second set of contacts disposed in said predetermined pattern and with the contacts in the second set in electrical engagement with the contacts in the first set, a guide mounted on one of said housing members and connected to the electrically conductive members, said guide being effective to maintain the contacts in said second set aligned in said predetermined pattern, and said first and second housing members connected together to form means effective to force the wafer toward the second set of contacts and to maintain the contacts in said sets compressed together, said first and second housing members being the sole means providing engagement of said contacts.

11. A package of the class described, including the combination of:

a flat first housing member having a base and a plurality of sidewalls at least partially defining a space, a second housing member secured to said sidewalls and extending across and sealing said space, a semiconductive wafer disposed in said space and having a first set of electrical contacts disposed in a predetermined pattern, a plurality of electrically conductive members extending through said first housing and forming a second set of electrical contacts arranged in said predetermined pattern and with the contacts in the second set engaging the contacts in the first set of contacts, and a member disposed between one of the housing members and the wafer and effective to force the contacts in the first set against the contacts in the second set to maintain electrical connection between the contacts in the first set and the contacts in the second set.

12. A package of the class described, including the combination of:

a first housing member having a base and a plurality of sidewalls at least partially defining a space, a second housing member secured to said sidewalls and extending across and sealing said space, a semiconductive wafer disposed in said space and having a first set of electrical contacts positioned in a predetermined pattern, a plurality of electrical leads extending through one of said housing members and into said space and with the inner ends of said electrical leads forming a second set of electrical contacts arranged in said predetermined pattern and with the contacts in the second set engaging the contacts in the first set of contacts, a member disposed between one of the said housing members and said wafer and with said member having at least one surface in heat exchanging relation with said wafer, and said first and second housing members connected together to form compression means effective to maintain the contacts in the first set compressed against the contacts in the second set to maintain electrical connection between the contacts in both sets, said first and second housing members being the sole means providing engagement of said contacts.

References Cited

UNITED STATES PATENTS

| | | | |
|---|---|---|---|
| 2,712,619 | 7/1955 | Zetwo | 174—52 |
| 2,980,832 | 4/1961 | Stein et al. | |
| 3,114,867 | 12/1963 | Szekely. | |
| 3,202,888 | 8/1965 | Evander et al. | 317—235 |
| 3,206,647 | 9/1965 | Kahn | 317—101 |
| 3,209,065 | 9/1965 | Steiner | 174—50 |
| 3,222,579 | 12/1965 | Fitzgibbon et al. | 317—235 |
| 2,672,580 | 3/1954 | Henderson et al. | 317—236 |
| 2,994,121 | 8/1961 | Shockley | 317—101 |
| 3,011,379 | 12/1961 | Corwin | 324—158 |
| 3,205,408 | 9/1965 | Boehm et al. | 317—101 |
| 3,234,320 | 2/1966 | Chih Wong. | |

| | | | |
|---|---|---|---|
| 2,734,102 | 2/1956 | Pankove | 317—234 |
| 2,994,810 | 8/1961 | Gudmundsen | 317—234 |
| 3,224,450 | 12/1965 | Lee et al. | 174—56 |
| 3,239,719 | 3/1966 | Shower | 317—101 |
| 3,289,046 | 11/1966 | Carr | 317—101 |
| 3,292,241 | 12/1966 | Carroll | 317—101 |

OTHER REFERENCES

Electronics World, vol. 72, No. 3, September 1964, TK6540, R623, pp. 27–29.

ROBERT K. SCHAFER, *Primary Examiner.*

D. SMITH, JR., *Assistant Examiner.*

U.S. Cl. X.R.

174—52; 29—588, 589